United States Patent
Ker et al.

(10) Patent No.: US 7,479,698 B2
(45) Date of Patent: Jan. 20, 2009

(54) BONDING PAD STRUCTURE DISPOSED IN SEMICONDUCTOR DEVICE AND RELATED METHOD

(75) Inventors: Ming-Dou Ker, Hsin-Chu (TW); Yuan-Wen Hsiao, Tai-Chung (TW); Yuh-Kuang Tseng, Tao-Yuan Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 5 days.

(21) Appl. No.: 11/753,567

(22) Filed: May 24, 2007

(65) Prior Publication Data
US 2008/0290457 A1 Nov. 27, 2008

(51) Int. Cl.
*H01L 23/48* (2006.01)
(52) U.S. Cl. .................... 257/734; 438/109; 257/686

(58) Field of Classification Search .............. 257/734, 257/528, 665, 686; 438/109, 215, 329
See application file for complete search history.

(56) References Cited

U.S. PATENT DOCUMENTS 7,038,294 B2 * 5/2006 Ma et al. ................. 257/528
7,265,433 B2 * 9/2007 Pillai et al. .............. 257/531

* cited by examiner

*Primary Examiner*—Roy K Potter
(74) *Attorney, Agent, or Firm*—Winston Hsu

(57) ABSTRACT

The present invention discloses a bonding pad structure disposed in a semiconductor device and a method for forming the bonding pad structure. The semiconductor device includes a substrate. The bonding pad structure includes a connection structure and an induction structure. The connection structure allows for a direct connection with a bonding wire. The induction structure is coupled with the connection structure and lowers an effective capacitance between the bonding wire and the substrate.

9 Claims, 4 Drawing Sheets

BONDING PAD STRUCTURE DISPOSED IN SEMICONDUCTOR DEVICE AND RELATED METHOD

BACKGROUND OF THE INVENTION

1. Field of the Invention

The present invention relates to a bonding pad structure in a semiconductor device, and more particularly, to a bonding pad structure capable of lowering the effective capacitance between a bonding wire and substrate.

2. Description of the Prior Art

Microchips (or chips) are common components in various electronic devices nowadays. In general, bonding pads must be disposed on a chip to allow external bonding wires to be electrically connected to a core circuit of the chip. The core circuit of the chip can transmit output signals to an external circuit or receive input signals transmitted from the external circuit through the bonding pads. In conventional semiconductor processes, a plurality of metal layers are utilized as main structures of the bonding pads in order to avoid a peel-off effect, and to ensure reliability of the bonding pads.

However, in the conventional bonding pad structure, there exists a parasitic capacitance between any two adjacent metal layers. There also exists a parasitic capacitance between the bottom metal layer and the substrate of the chip. The parasitic capacitances contribute equally to the effective capacitances of the connecting bonding wires to the substrate. Since effective capacitances exist between the bonding wires and the substrate, there will be signal loss to the substrate due to the effective capacitances of the bonding pads during operation of the external circuit transmitting signals to the core circuit through the bonding wires and the bonding pads. Signal loss will also result from operation of the core circuit when transmitting signals to the external circuit through the bonding pads and the bonding wires. Furthermore, the effective capacitances of the bonding pads will also lower noise immunity of the bonding pads against the substrate, and therefore increase the noise figure. All of these negative effects will reduce optimal performance of the chip, especially for high speed device applications where these defects will be more obvious.

SUMMARY OF THE INVENTION

It is therefore one of the objectives of the present invention to provide a bonding pad structure capable of reducing an equivalent capacitance between a bonding wire and a substrate to solve the problems of the conventional techniques described above.

According to an embodiment of the present invention, a bonding pad structure disposed in a semiconductor device is disclosed. The semiconductor device includes a substrate. The bonding pad structure includes a connection structure and an induction structure. The connection structure allows for a direct connection from a bonding wire. The induction structure is coupled with the connection structure and lowers an effective capacitance between the bonding wire and the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
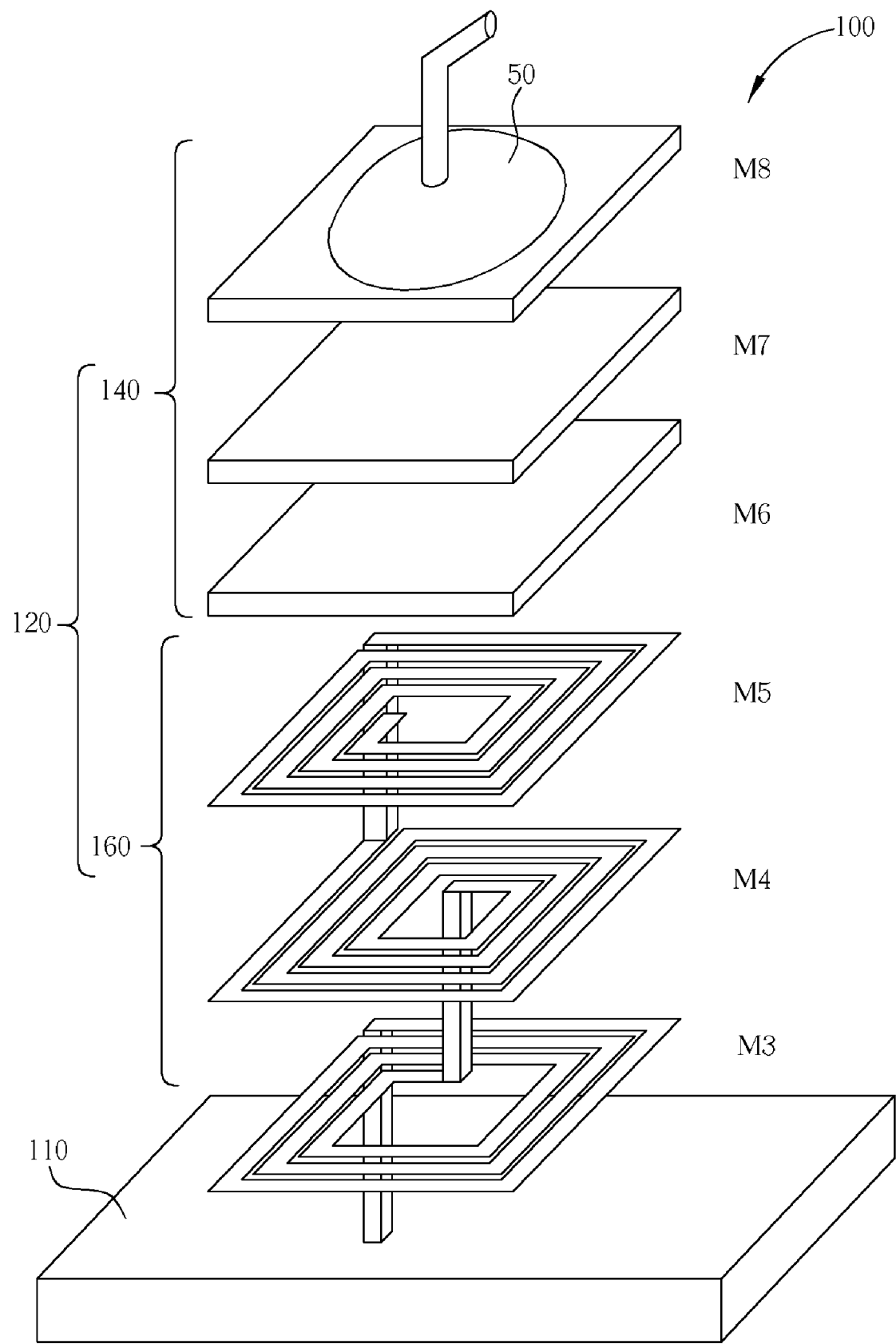
FIG. 1 illustrates a bonding pad structure according to a first embodiment of the present invention.

Please refer to FIG. 1. FIG. 1 shows a bonding pad structure according to a first embodiment of the present invention. The bonding pad structure 120 of the embodiment is disposed in a semiconductor device 100 for electrically connecting a bonding wire 50 to a core circuit (not shown) in the semiconductor device 100. The semiconductor device 100 includes a substrate 110. The bonding pad structure 120 includes a connection structure 140 and an induction structure 160.

The connection structure 140 allows the bonding wire 50 to be connected to the core circuit for allowing electrical signals to transmit between the bonding wire 50 and the core circuit. In this embodiment, the connection structure 140 includes three metal layers M6, M7, and M8, wherein the metal layers M6 and M7 are connected to each other through a single via or a plurality of vias, and metal layers M7 and M8 are connected to each other also through a single via or a plurality of vias. Metal layer M8 allows for the direct connection of the bonding wire 50.

The induction structure 160 is coupled with the connection structure 140 and utilized to lower an effective capacitance $C_{eff}$ between the bonding wire 50 and the substrate 110. In this embodiment, the induction structure 160 includes three metal layers M3, M4, and M5, wherein each of the metal layers forms a coil structure, and the coil structure formed by the metal layer M3 is connected to the substrate 110 through a via and connected to the coil structure formed by the metal layer M4 through another via. The coil structure formed by the metal layer M4 is connected to the coil structure formed by the metal layer M5 also through a via.

Furthermore, spaces between each metal layer in the bonding pad structure 120 and spaces between each coil structure in the induction structure 160 can be filled with a dielectric material.

Figure 2:
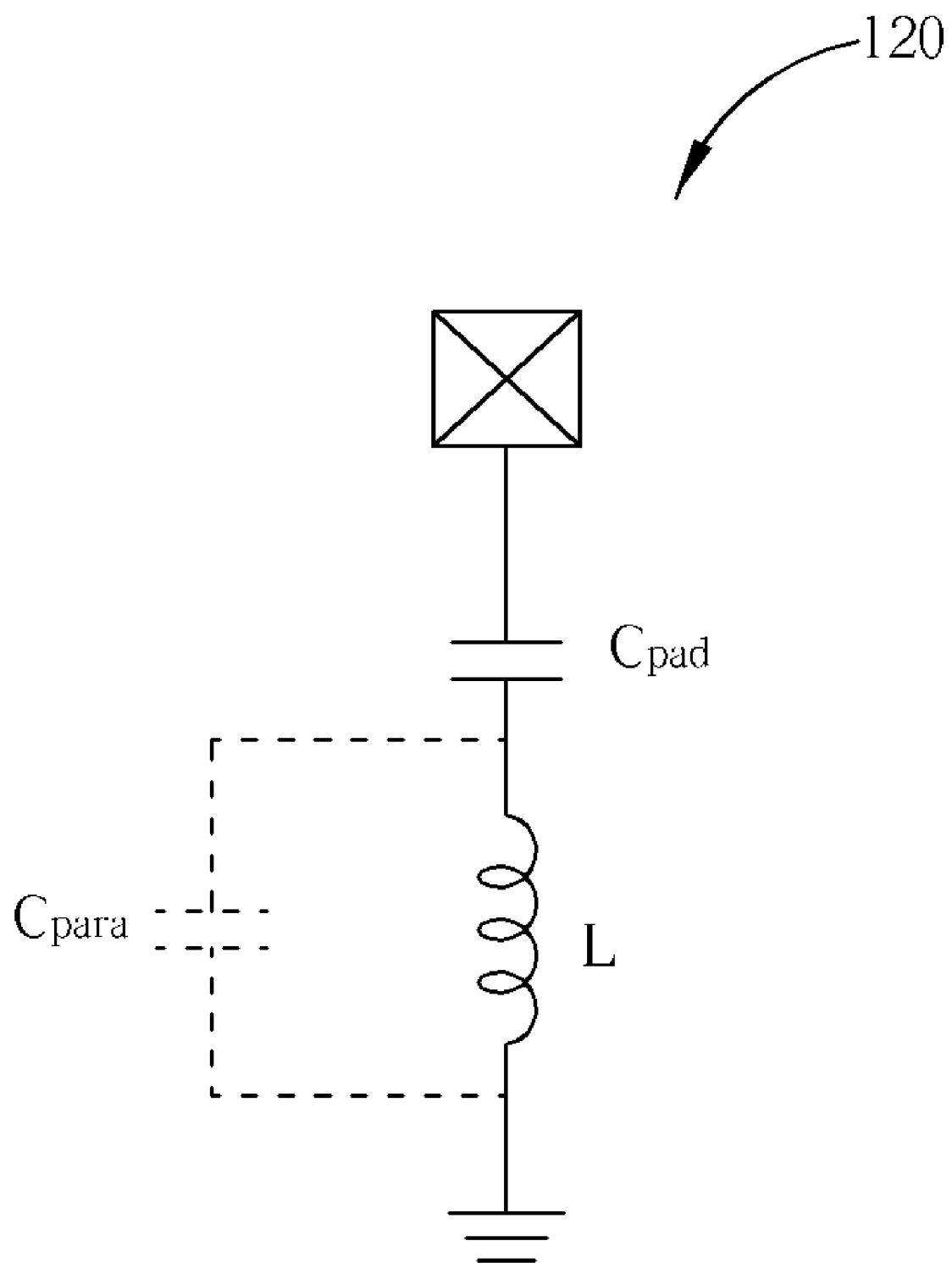
FIG. 2 shows an equivalent circuit diagram of the bonding pad structure shown in FIG. 1.

FIG. 2 shows an equivalent circuit diagram of the bonding pad structure 120, wherein $C_{pad}$ is an effective capacitance between the bonding wire 50 and the metal layer M5, L is an effective inductance between the metal layer M5 and the substrate 110, $C_{para}$ is a parasitic capacitance within the induction structure 160, and the substrate 110 is presented by a ground symbol in FIG. 2. The entire effective capacitance $C_{eff}$ between the bonding wire 50 and the substrate 110 is shown by the formula below:

$$C_{eff} = \cfrac{1}{\cfrac{1}{C_{pad}} + \cfrac{1}{C_{para} - \cfrac{1}{\omega^2 L}}}$$

From the above formula, we note that $C_{eff}$ will be smaller than $C_{pad}$ in a specific frequency range, and $C_{eff}$ will approach zero under the condition of $\omega=1/\sqrt{LC_{para}}$. In other words, the effective capacitance $C_{eff}$ between the bonding wire 50 and the substrate 110 can be effectively reduced in this specific frequency range. Therefore, when signals are transmitted between the bonding wire 50 and the core circuit through the bonding pad structure 120, the probability of signal loss to the substrate 110 will be lower. Additionally, since there is a lower effective capacitance $C_{eff}$ between the bonding wire 50 and the substrate 110 in this embodiment, noise immunity of the bonding wire 50 against the substrate 110 will be better, and the noise figure of the bonding pad structure 120 will therefore be lower. The above description is summarizes the advantages of the bonding pad structure 120 in this embodiment in light of the conventional bonding pad structure.

In the embodiment shown in FIG. 1, since the induction structure 160 is disposed immediately below the connection structure 140 (i.e. the induction structure 160 is positioned between the connection structure 140 and the substrate 110, and the induction structure 160 and the connection structure 140 have substantially the same surface area size), adding the induction structure 160 will not cause the bonding pad structure 120 to occupy more surface area in the semiconductor device 100. Additionally, the bonding pad structure 120 of the embodiment is completely compatible with the common complementary metal oxide semiconductor (CMOS) process, and no special masks or processes will be required due to the addition of the induction structure 160. Therefore, the bonding pad structure 120 of the embodiment will not increase fabrication costs of the semiconductor device 100.

Please note that although the connection structure 140 and the induction structure 160 both include three metal layers, and each of the metal layers in the induction structure 160 forms a square coil structure in the embodiment shown in FIG. 1, this is not, however, a limitation of the present invention. In other words, in a bonding pad structure of another embodiment, connection structures can include a single metal layer, or a plurality of metal layers, and induction structure can include one or a plurality of metal layers. Each of the metal layers in the induction structure can be a coil structure having a square shape or another shape (e.g. circle, octagon, . . . etc.). Furthermore, in the bonding pad structure of certain embodiments, the inductor structure is not necessarily connected to a substrate through a via. If the induction structure and the substrate are not connected to each other through a via, there is still a lower effective capacitance between the bonding wire and the substrate.

Additionally, in the embodiment shown in FIG. 1, although the single bonding pad structure 120 is formed by the single connection structure 140 with the single induction structure 160, in other embodiments, a single bonding pad structure (the single bonding pad structure can allow a plurality of bonding wires to be directly connected) can also be formed by a plurality of connection structures with single induction structure, or formed by a plurality of adjacent induction structures with single connection structure. These can all be practically implemented, and all of the formed bonding pad structures can generate a lower effective capacitance between the bonding wire and the substrate.

Figure 3:
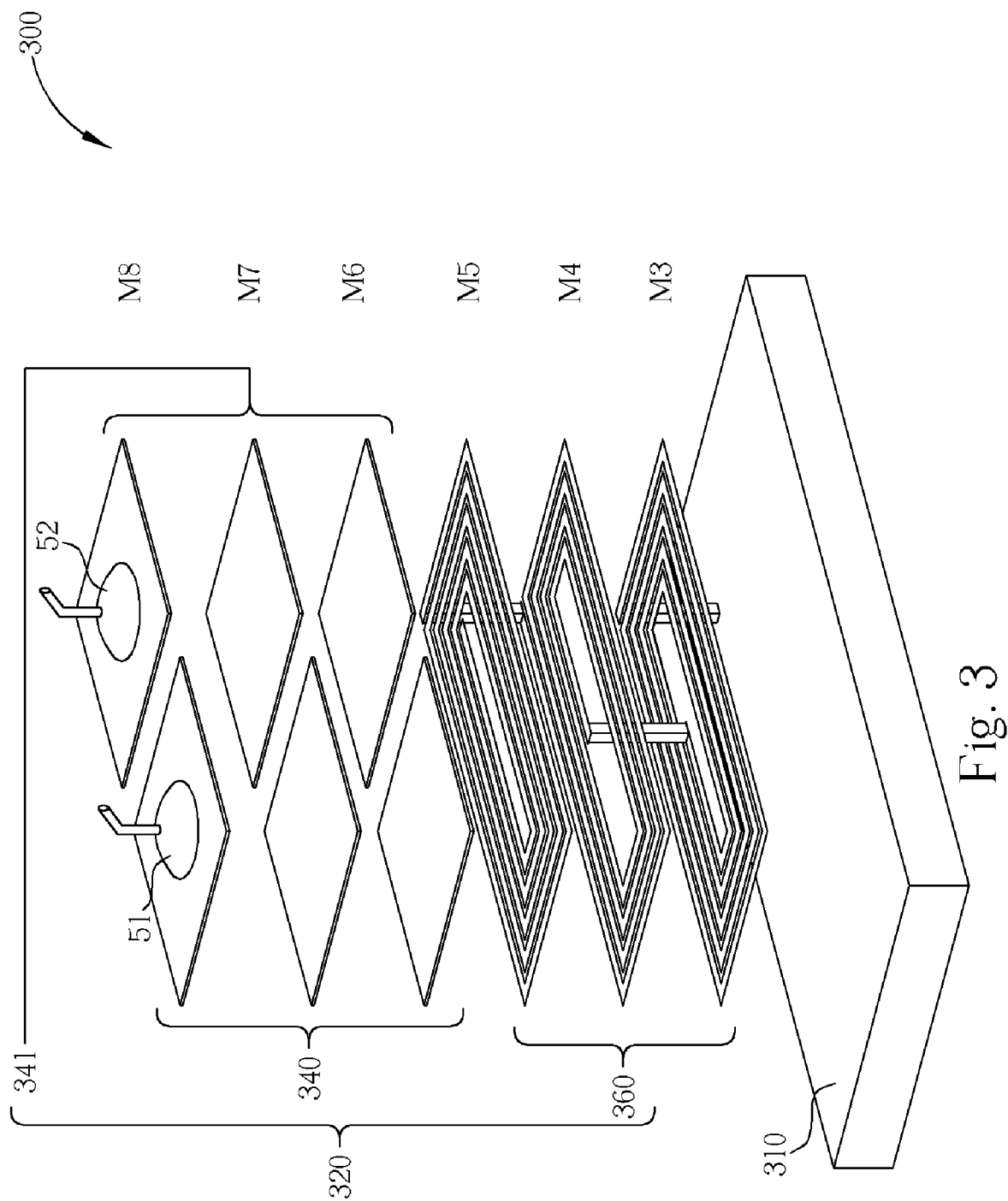
FIG. 3 illustrates a bonding pad structure according to a second embodiment of the present invention.
Figure 4:
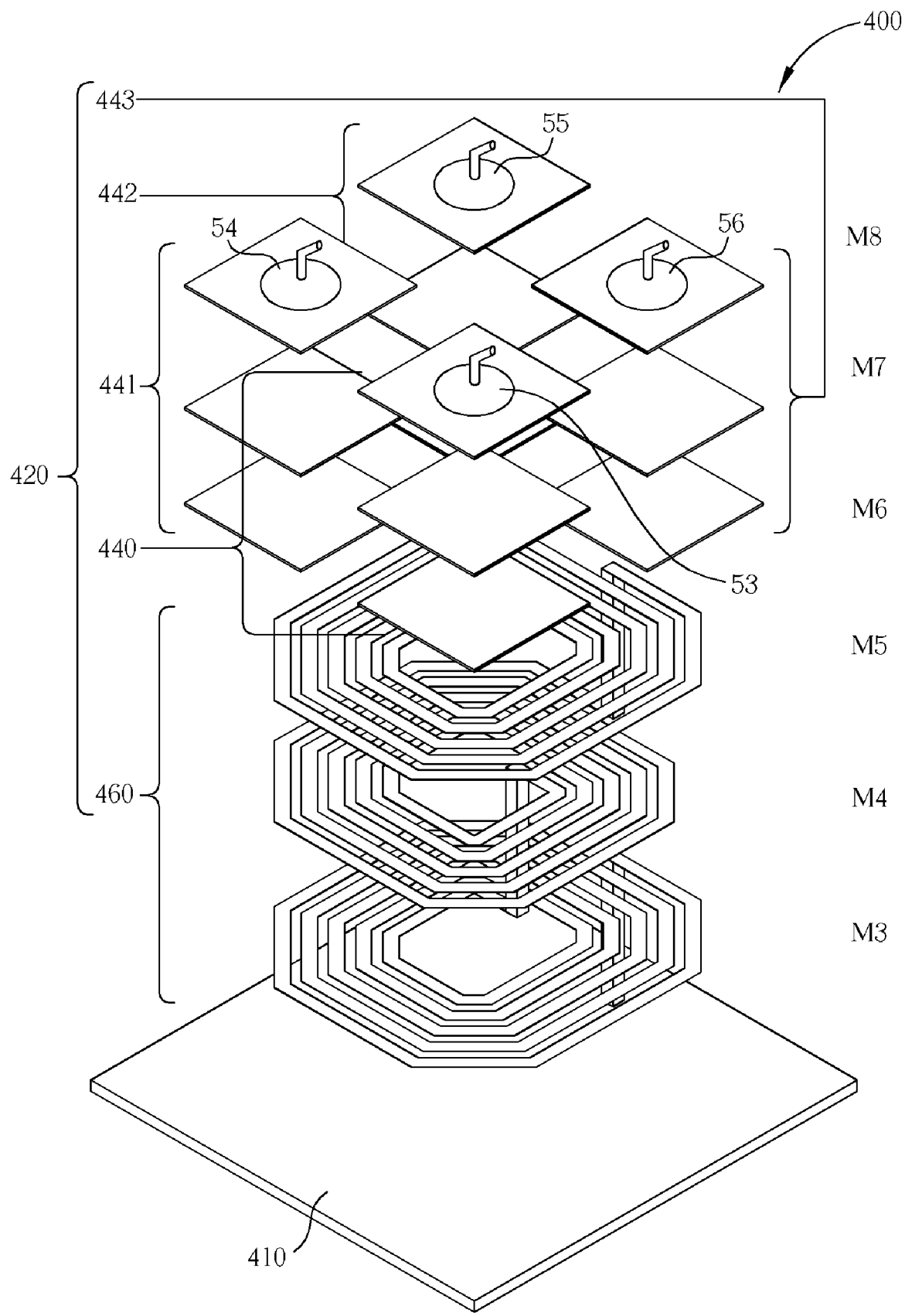
FIG. 4 illustrates a bonding pad structure according to a third embodiment of the present invention.

For example, in an embodiment shown in FIG. 3, a bonding pad structure 320 is formed by two connection structures 340 and 341 with an induction structure 360. The connection structures 340 and 341 are utilized to allow the bonding wires 51 and 52 to be respectively connected to a core circuit (not shown) in the semiconductor device 300. Different metal layers in the connection structures 340 and 341 can also be connected to each other through a single via or a plurality of vias (not shown). Since the induction structure 360 is included, there will be a lower effective capacitance $C_{eff1}$ between the bonding wire 51 and the substrate 310, and also a lower effective capacitance $C_{eff2}$ between the bonding wire 52 and the substrate 310. According to an embodiment shown in FIG. 4, a bonding pad structure 420 is formed by four connection structures 440, 441, 442, and 443 with an induction structure 460. The connection structures 440, 441, 442, and 443 are utilized to allow the bonding wires 53, 54, 55, and 56 to be respectively connected to a core circuit (not shown) in the semiconductor device 400. Different metal layers in the connection structures 440 and 441 can be connected to each other through a single via or a plurality of vias (not shown). Furthermore, each of the metal layers in the induction structure 460 forms an octagon coil structure. Since the induction structure 460 is included, there will be lower effective capacitances $C_{eff3}$, $C_{eff4}$, $C_{eff5}$, and $C_{eff6}$ between the bonding wires 53 and the substrate 410, the bonding wires 54 and the substrate 410, the bonding wires 55 and the substrate 410, the bonding wires 56 and the substrate 410, respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bonding pad structure disposed in a semiconductor device, the semiconductor device having a substrate, the bonding pad structure comprising:
    a connection structure, for allowing a direct connection from a bonding wire; and
    an induction structure, coupled with the connection structure, for lowering an effective capacitance $C_{eff}$ between the bonding wire and the substrate, the induction structure comprising at least a metal layer;
    wherein the effective capacitance $C_{eff}$ satisfies a formula as below:

$$C_{eff} = \frac{1}{\frac{1}{C_{pad}} + \frac{1}{C_{para} - \frac{1}{\omega^2 L}}}$$

wherein $C_{pad}$ is an effective capacitance between the bonding wire and the metal layer, L is an effective inductance between the metal layer and the substrate, $C_{para}$ is a parasitic capacitance within the induction structure, and $\omega$ is a signal frequency; $C_{eff}$ is smaller than $C_{pad}$ in a specific frequency range, and $C_{eff}$ is substantially equal to zero under a condition of $\omega=1/\sqrt{LC_{para}}$.

2. The bonding pad structure of claim 1, wherein the induction structure is disposed between the substrate and the connection structure.

3. The bonding pad structure of claim 1, wherein a surface area size of the induction structure is substantially equal to a surface area size of the connection structure.

4. The bonding pad structure of claim 1, wherein the induction structure comprises a plurality of metal layers, and each of the metal layers forms a coil structure.

5. The bonding pad structure of claim 4, wherein every two adjacent metal layers of the induction structure are connected to each other through a via.

6. A method for forming a bonding pad structure in a semiconductor device, comprising:
- forming a connection structure on a substrate of the semiconductor device; and
- forming an induction structure comprising at least a metal layer on the connection structure;
- wherein the connection structure and the induction structure form the bonding pad structure, and the connection structure allows a direct connection from a bonding wire;
- wherein an effective capacitance $C_{\mathit{eff}}$ between the bonding wire and the substrate satisfies a formula as below:

$$C_{\mathit{eff}} = \frac{1}{\dfrac{1}{C_{pad}} + \dfrac{1}{C_{para} - \dfrac{1}{\omega^2 L}}}$$

wherein $C_{pad}$ is an effective capacitance between the bonding wire and the metal layer, L is an effective inductance between the metal layer and the substrate, $C_{para}$ is a parasitic capacitance within the induction structure, and $\omega$ is a signal frequency; $C_{\mathit{eff}}$ is smaller than $C_{pad}$ in a specific frequency range, and $C_{\mathit{eff}}$ is substantially equal to zero under a condition of $\omega = 1/\sqrt{LC_{para}}$.

7. The method of claim 6, wherein a surface area size of the induction structure is substantially equal to a surface area size of the connection structure.

8. The method of claim 6, wherein the induction structure comprises a plurality of metal layers, and each of the metal layers forms a coil structure.

9. The method of claim 8, wherein every two adjacent metal layers of the induction structure are connected to each other through a via.

\* \* \* \* \*